US006409453B1

(12) United States Patent
Brodine et al.

(10) Patent No.: US 6,409,453 B1
(45) Date of Patent: Jun. 25, 2002

(54) END EFFECTOR FOR WAFER HANDLER IN PROCESSING SYSTEM

(75) Inventors: Jeff Brodine, Los Gatos; Dan Marohl, San Jose, both of CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/588,616

(22) Filed: Jun. 6, 2000

Related U.S. Application Data

(63) Continuation of application No. 09/025,320, filed on Feb. 18, 1998, now abandoned.

(51) Int. Cl.[7] .............................................. B65B 49/07
(52) U.S. Cl. ........................................ 414/416; 414/941
(58) Field of Search ............................. 414/941, 416, 414/940, 939, 935; 294/64.1

(56) References Cited

U.S. PATENT DOCUMENTS

| | | | |
|---|---|---|---|
| 4,897,015 A | | 1/1990 | Abbe et al. .............. 414/744.8 |
| 4,949,783 A | | 8/1990 | Lakios et al. .............. 165/80.1 |
| 5,004,399 A | | 4/1991 | Sullivan et al. ............. 414/729 |
| 5,064,340 A | | 11/1991 | Genov et al. ............. 414/744.5 |
| 5,102,495 A | | 4/1992 | Maher et al. ................ 156/643 |
| 5,288,379 A | | 2/1994 | Namiki et al. ......... 204/192.12 |
| 5,447,409 A | | 9/1995 | Grunes et al. ............ 414/744.6 |
| 5,516,732 A | | 5/1996 | Flegal ......................... 437/250 |
| 5,609,689 A | | 3/1997 | Kato et al. ................... 118/719 |
| 5,643,366 A | | 7/1997 | Somekh et al. ............. 118/721 |
| 5,647,626 A | | 7/1997 | Chen et al. ................. 294/87.1 |
| 5,653,565 A | | 8/1997 | Bonora et al. .............. 414/411 |
| 5,700,046 A | * | 12/1997 | Van Doren et al. ...... 294/119.1 |
| 5,711,646 A | | 1/1998 | Ueda et al. ................. 414/225 |
| 5,711,647 A | | 1/1998 | Slocum ....................... 414/749 |
| 5,746,460 A | | 5/1998 | Marohl et al. ............... 294/1.1 |
| 5,749,469 A | | 5/1998 | Williams ..................... 206/710 |
| 5,765,889 A | * | 6/1998 | Nam et al. .................. 294/64.1 |
| 5,789,878 A | | 8/1998 | Kroeker et al. ................ 318/45 |
| 5,810,935 A | * | 9/1998 | Lee et al. .................... 118/728 |
| 5,957,651 A | | 9/1999 | Takebayaski et al. ..... 414/744.5 |
| 5,980,194 A | | 11/1999 | Freerks et al. .............. 414/754 |
| 6,116,848 A | * | 9/2000 | Thomas et al. ............. 414/754 |
| 6,149,368 A | * | 11/2000 | Reyes, Jr. et al. .......... 414/941 |
| 6,167,322 A | * | 12/2000 | Holbrooks .................. 700/112 |
| 6,216,883 B1 | * | 4/2001 | Kobayashi et al. ...... 211/41.18 |

FOREIGN PATENT DOCUMENTS

| | | | |
|---|---|---|---|
| EP | 0 342 940 A3 | 11/1989 | .......... H01L/21/00 |
| EP | 0 342 940 A2 | 11/1989 | .......... H01L/21/00 |
| EP | 0 776 035 A1 | 5/1997 | .......... H01L/21/68 |
| EP | 0 820 091 A2 | 1/1998 | .......... H01L/21/00 |
| JP | 4-279043 | 10/1992 | .......... H01L/21/68 |
| JP | 5-13550 | 1/1993 | .......... H01L/21/68 |

OTHER PUBLICATIONS

PCT International Search Report Application No. PCT/US99/03114, dated Feb. 11, 1999.
"300mm Cassette Standard," SEMI: 300mm Carrier & Interface Ballots, pp. 15–16, Mar. 26, 1996.

* cited by examiner

*Primary Examiner*—Douglas Hess
(74) *Attorney, Agent, or Firm*—Moser, Patterson & Sheridan LLP

(57) ABSTRACT

A vacuum processing system has one or more wafer handler with an end effector that, starting at its fixed end, tapers inwardly to form side recesses on opposing sides of the end effector and then tapers outwardly to a free end that is wider than the fixed end. At its free end, the end effector has another recess defining a pair of fingers with wafer supports thereon. The free end recess extends into the wafer sense cutout area. The pair of fingers providing the wafer supports at the free end of the end effector are spaced wider than the innermost exclusion zones for a standard 300 mm wafer carrier, but closer together than the outermost exclusion zones. In one embodiment, the end effector has a three-point ball, or bump, support for the wafer.

16 Claims, 7 Drawing Sheets

END EFFECTOR FOR WAFER HANDLER IN PROCESSING SYSTEM

This application is a continuation of application Ser. No. 09/025,320 filed Feb. 18, 1998 now abandoned.

BACKGROUND OF THE INVENTION

1. Field of the Invention

The present invention generally relates to the storage and transfer of wafers typically used in the fabrication of integrated circuits. Specifically, the invention relates to the end effector, or blade, of a wafer handler used to transfer wafers through and between chambers in a system, for processing the wafers.

2. Background of the Related Art

Vacuum processing systems for processing 100 mm, 200 mm, 300 mm or other diameter wafers are generally known. Typically, such vacuum processing systems have a centralized transfer chamber mounted on a monolith platform. The transfer chamber is the center of activity for the movement of wafers being processed in the system. One or more process chambers mount on the transfer chamber at slit valves through which wafers are passed by a wafer handler, or robot, in the transfer chamber. The valves close in order to isolate the process chambers while wafers are being processed therein. The wafer handler transfers the wafers through the transfer chamber and between the various other chambers attached to the transfer chamber.

Some common transfer chambers have facets to accommodate four to six chambers. The process chambers include rapid thermal processing (RTP) chambers, physical vapor deposition (PVD) chambers, chemical vapor deposition (CVD) chambers, etch chambers, etc. Physically, the process chambers are either supported by the transfer chamber and its platform or are supported on their own platform. Inside the system, the transfer chamber is typically held at a constant vacuum; whereas, the process chambers may be pumped to a greater vacuum for performing their respective processes. Afterward, the chamber pressure must be returned to the level in the transfer chamber before opening the valve to permit access between the chambers.

For some vacuum processing systems, such as the Centura ™ system from Applied Materials, Inc., access to the transfer chamber for wafers from the exterior of the system, or from the manufacturing facility, is typically through one or more load lock chambers. For some other vacuum processing systems, such as the Endura ™ system from Applied Materials, Inc., a series of other chambers, including a buffer chamber, are provided between the transfer chamber and the load lock chambers. Thus, the transferring of the wafers through the vacuum in the system proceeds in stages, with the buffer chamber typically operating at about $1 \times 10^{-6}$ torr, the transfer chamber typically operating at about $1 \times 10^{-7}$ torr and the process chambers typically operating at about $1 \times 10^{-9}$ torr in the case of physical vapor deposition process chambers.

The buffer chamber is an intermediate transfer chamber that may have optional preprocessing or post-processing chambers attached to it for performing additional processing steps on the wafers. Additionally, a pre-clean chamber and a cool-down chamber are interposed between the buffer chamber and the transfer chamber. Since the buffer chamber and the transfer chamber are typically held at different vacuum levels, the pre-clean chamber transitions the wafers from the vacuum level of the buffer chamber to the vacuum level of the transfer chamber in addition to cleaning the wafers in preparation for processing in the process chambers. After undergoing the primary process, the cool-down chambers transition the wafers from the vacuum level of the transfer chamber to the vacuum level of tie buffer chamber while cooling the wafers. Another wafer handler, similar to the one disposed in the transfer chamber, is disposed within the buffer chamber in order to transfer the wafers through the buffer chamber and between the various chambers attached thereto.

The load lock chambers cycle between the pressure level of the ambient environment and the pressure level in either the transfer chamber or the buffer chamber in order for the wafers to be passed therebetween, so the-load lock chambers transition the wafers between the atmosphere pressure of a very clean environment to the vacuum of the system. The load lock chambers attach to a mini-environment which transfers wafers in a very clean environment at atmospheric pressure from wafer pods to the load lock chambers. Thus, the mini-environment has another wafer handler for transferring the wafers.

The wafer handlers in the transfer chamber and the buffer chamber are typically very similar, if not identical. An example of such a wafer handler 10 is shown in FIGS. 1a and 1b. the wafer handler 10 is capable of rotational movement, but not translational movement since it is fixed in the center of its chamber. The wafer handler 10 has an end effector 12, 14, or blade, attached to an arm assembly 16 attached to the rotating portion 18 of the wafer handler 10. A wafer sits on the end effector 12, 14 in order to be transferred. A sensor beam may be projected through the wafer sense hole 15 in order to sense the presence of a wafer on the end effector 12, 14. The sensor beam may be an infrared beam directed at a detector. The wafer sense hole 15 is typically a standard size, and may be about 0.87 inches, or 22 mm, in radius. The arm assembly 16 moves the end effector 12, 14 radially outward from and inward towards the wafer handler 10 in order to insert a wafer into or retrieve a wafer from a chamber.

The wafer handler in the mini-environment is typically different from those in the transfer chamber or the buffer chamber, since it is usually capable of translational movement as well as rotational movement. A top view of an example of such a wafer handler 20 is shown in FIG. 1c. The wafer handler 20 is typically track mounted so that it can move back and forth inside the mini-environment in order to service each of the pod loaders and load lock chambers attached thereto. The wafer handler 20 has an end effector 22 attached to an arm assembly 24 attached to the rotating portion 26 of the wafer handler 20. A wafer sits on the end effector 22 in order to be transferred. The arm assembly 24 moves the end effector 22 radially outward from and inward towards the rotating portion 26. The contact portion 25 of the end effector 22 is typically the only part of the end effector 22 that contacts the wafer. The contact portion 25 typically uses vacuum suction to hold the wafer. Vacuum suction Is not a practical method to hold a wafer inside the transfer chamber or the buffer chamber, however, since these areas are already subject to a vacuum, which would lessen the hold of the vacuum suction. Additionally, it is desirable to have only one style of end effector, which may be used with all wafer handlers, in order to reduce the number of parts used in a processing system.

The end effector 14, shown in FIG. 1a, has a constant width from the end effector mounting 27, or robot blade wrist, to the free end. A short recess in the free end forms two projections at the free end. A wafer is supported on small shelves located near the free end on the two projections and near the end fixed at the mounting 27. The shelf supports may provide no more than about 120 mils of space between the wafer and the end effector 14. For 300 mm wafers, the width poses a problem with the exclusion zones defined by the SEMI 300 mm Wafer Carrier and Interface Standard, a standard set by Semiconductor Equipment and Materials International to create, inter alia, an industry standard configuration for a wafer carrier.

The exclusion zones are areas within a 300 mm wafer carrier or holder reserved for the wafer carrier to support the wafer and are illustrated by the areas 100, 102 as shown in FIG. 4. The exclusion zones 100 are about 29 mm wide, 170 mm long and 250 mm apart. The exclusion zones 102 are about 25 mm wide, 32 mm long and 100 mm apart. The center of a wafer will be almost directly in the geometric center of the combined exclusion zones 100, and offset from the exclusion zones 102 by about 120 mm. An end effector may not cross these areas while lifting a wafer off of the supports in the wafer carrier, or there will be interference between the end effector and the wafer carrier supports. Thus, an end effector must be designed to avoid the exclusion zones 100, 102. The end effector 14, shown in FIG. 1a, however. will cross directly into part of the exclusion zones 102.

One solution to avoid the exclusion zones 100, 102 is illustrated by the end effector 12, shown in FIG. 1b. Also. the outline of the end effector 12 is shown, in dashed lines, in FIG. 4 with respect to the exclusion zones. The end effector 12 has a constant width, similar to the end effector 14, except that it tapers almost immediately near the mounting end to a narrower width, which is then constant to the free end. Thus, the two projections at the free end of the end effector 12 will pass between the exclusion zones 102, as illustrated in FIG. 4. A problem with the end effector 12 is that since the supports at the two projections are so close together, the wafer is unstable on these supports. A less stable support structure requires that the wafers be moved more slowly, so they don't slide on the end effector. Thus, the throughput of the processing system is decreased. Another problem with the supports at the free end of the end effector 12 being so close together is that, since the 300 mm wafer is so large, the wafer may bow, or sag, in the middle. Since the shelves that support the wafer on the end effector 12 may be no more than about 120 mils high, there is the potential for the underside of the wafer to become contaminated by sagging low enough to touch the end effector 12 near its center.

Another solution for avoiding the exclusion zones 100, 102 and providing a stable support and avoiding wafer bowing is to provide an end effector that is wider than end effector 14, so the projections at the free end will pass outside of the exclusion zones 102, but inside the exclusion zones 100. A problem with an end effector that is generally shaped like the end effector 14, but which tapers outward almost immediately to form a constant width, is that its greater mass would cause it to have a greater momentum which would result in slower acceleration and deceleration of the end effector, and consequently, a longer time to move the wafer through the chamber. Another problem with the heavier end effector is that it would require a stronger; and therefore, more expensive; arm assembly 16, 24 to support and move the end effector.

A need, therefore, exists for an end effector that may be used in any chamber with any wafer handler, that avoids the exclusion zones, provides a stable support for the wafers and is light weight.

SUMMARY OF THE INVENTION

A vacuum processing system has, in its transfer chamber, buffer chamber and/or mini-environment, environment, a wafer handler with an end effector that, starting at its fixed end, tapers inwardly to side recesses on opposing sides of the end effector and then tapers outwardly to a free end wider than the fixed end and that, at its free end, has another recess defining a pair of fingers with wafer supports thereon. The free end recess extends into the wafer sensor cutout area. The side recesses and the free end recess extend into the end effector to limit the weight of the end effector while maintaining its strength. The side recesses give the end effector a unique hourglass shape.

The pair of fingers providing the wafer supports at the free end of the end effector are spaced wider than the innermost exclusion zones for a standard 300 mm wafer carrier, but closer together than the outermost exclusion zones. In other words, the pair of fingers have inner facing edges that are at least about 150 mm to about 160 mm apart and have outer opposing edges that stable support platform for the wafer and prevents the wafer from bowing.

In one embodiment, the end effector has a three-point support for the wafer at locations near the fixed end of the end effector arid on the two fingers near the free end. The three-point support may be a ball or bump support configuration.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
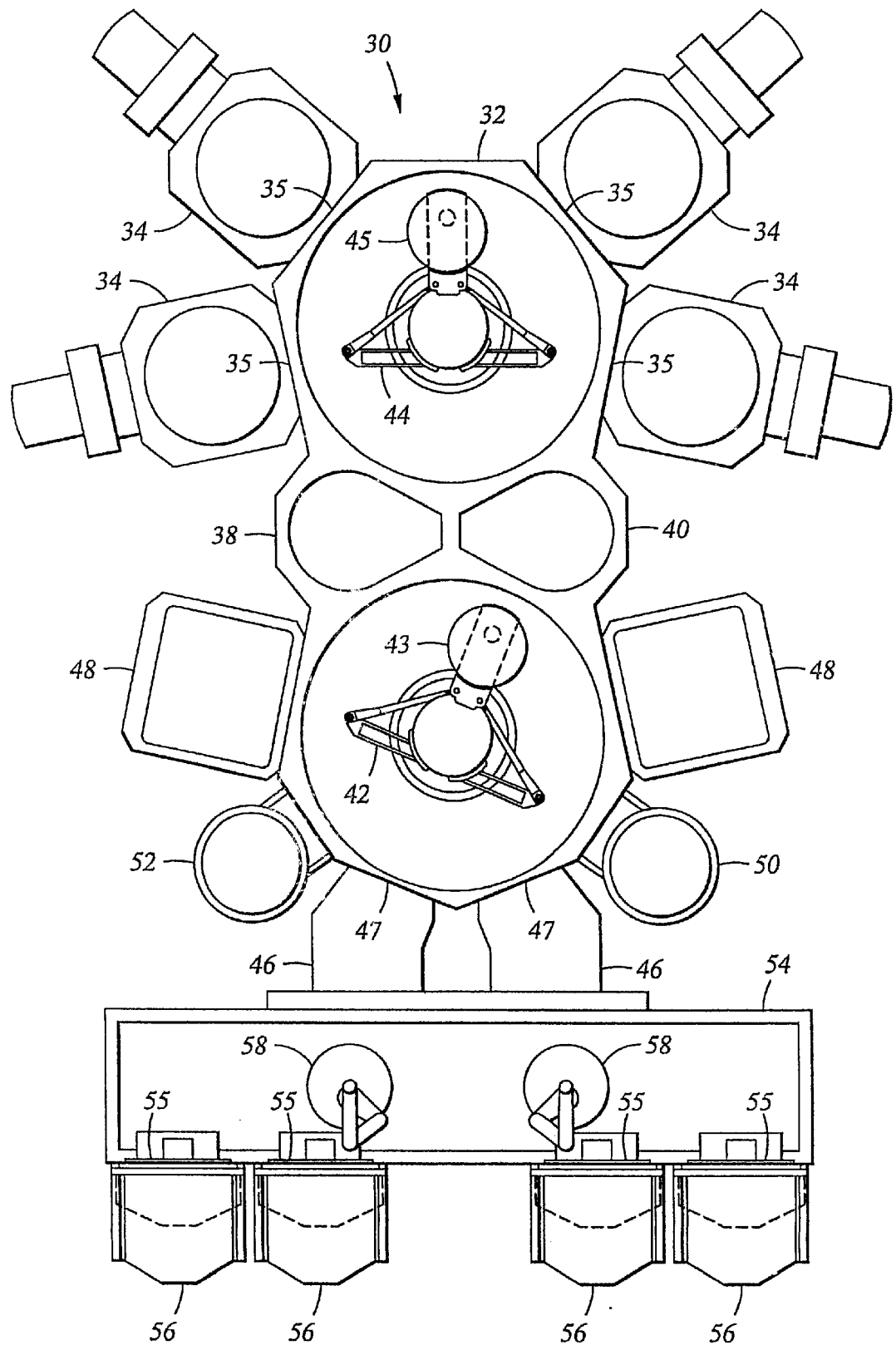
FIG. 2 is a top schematic view of a vacuum processing system having multiple wafer handlers.

FIG. 2 generally shows a schematic top view of an embodiment of a vacuum processing manufacturing integrated circuits on wafers in a vacuum. The vacuum processing system 30 includes a transfer chamber 32 and a buffer chamber 36 typically mounted on a platform (not shown) and generally forming a system monolith. The transfer chamber 32 has four process chambers 34 mounted at facets 35. The system monolith has two load lock chambers 46 mounted at facets 47. A mini-environment 54 attaches to the load lock chambers 46. The transfer chamber 32, the buffer chamber 36 and the mini-environment 54 each have at least one wafer handler 44, 42, 58, or robot, for transferring wafers therethrough. Each of these wafer handlers 44, 42, 58 has at least one end effector (described below) designed to hold the wafers.

The process chambers 34 perform the process on the wafers in the vacuum processing system 30. Process chambers 34 may be any type of process chamber, such as a rapid thermal processing chamber, a physical vapor deposition chamber, a chemical vapor deposition chamber, an etch chamber, etc. The process chambers 34 may be supported by the transfer chamber 32 or may be supported on their own platforms depending on the configuration of the individual process chambers 34. Slit valves (not shown) in the facets 35 provide access and isolation between the transfer chamber 32 and the process chambers 34. Correspondingly, the process chambers 34 have openings (not shown) on their surfaces that align with the slit valves.

A pre-clear chamber 38 and a cool-down chamber 40 may be disposed between the transfer chamber 32 and the buffer chamber 36. The pre-clean chamber 38 cleans the wafers before they enter the transfer chamber 32, and the cool-down chamber 40 cools the wafers after they have been processed in the process chambers 34. The pre-clean chamber 38 and the cooldown chamber 40 may also transition the wafers between the vacuum levels of the transfer chamber 32 and the buffer chamber 36. The buffer chamber 36 has two expansion chambers 48 for performing additional processes on the wafers. The buffer chamber 36 further has a degas chamber 50 for driving off moisture on the wafers if necessary. A wafer aligner chamber 52 is typically attached to the buffer chamber 36 with a wafer aligner disposed therein for receiving the wafers from the wafer handler 42 aligning the wafers before the wafer handler 42 transfers the wafers to the pre-clear chamber 38 or a pre-processing chamber 48. Alternatively, the chambers 38, 40 may both be pass-through/cool-down chambers, and the chambers 48 may be The load lock chambers 46 transition the wafers between the ambient environment pressure to the buffer chamber vacuum pressure. Openings (not shown) in facets 47 provide access and valves provide isolation between the load lock chambers 46 and the buffer chamber 36. Correspondingly, the load lock chambers 46 have openings on their surfaces that align with the openings in facets 47. One load lock chambers 46 and the mini-environment 54 have corresponding openings (not shown) providing access therebetween, while doors (not shown) for the openings provide isolation.

The mini-environment 54 has four pod loaders 56 attached on its front side. Openings (not shown) with corresponding doors 55 provide access and isolation between the mini-environment 54 and the pod loaders 56. The pod loaders 56 are mounted on the side of the minienvironment 54 and are essentially shelves for supporting the wafer pods (not shown) used to transport the wafers to and from the vacuum processing system 30.

The wafer handler 44 is disposed within the transfer chamber 32 for transferring a wafer 45 between the pre-clean chamber 38, the cool-down chamber 40 and the process chambers 34. A similar wafer handler 42 is disposed within the buffer chamber 36 for transferring a wafer 43 between the load lock chambers 46, the. expansion chambers 48, the degas chamber 50, the wafer aligner chamber 52, the pre-clean chamber 38 and the cool-down chamber 40. Likewise, one or more wafer handlers 58 are disposed within the mini-environment 54 for transferring the wafers between the pod loaders 56 and the load lock chambers 46. The wafer handler 58 is typically mounted on a track so the wafer handler 58 can move back and forth in the mini-environment 54.

Figure 1A:
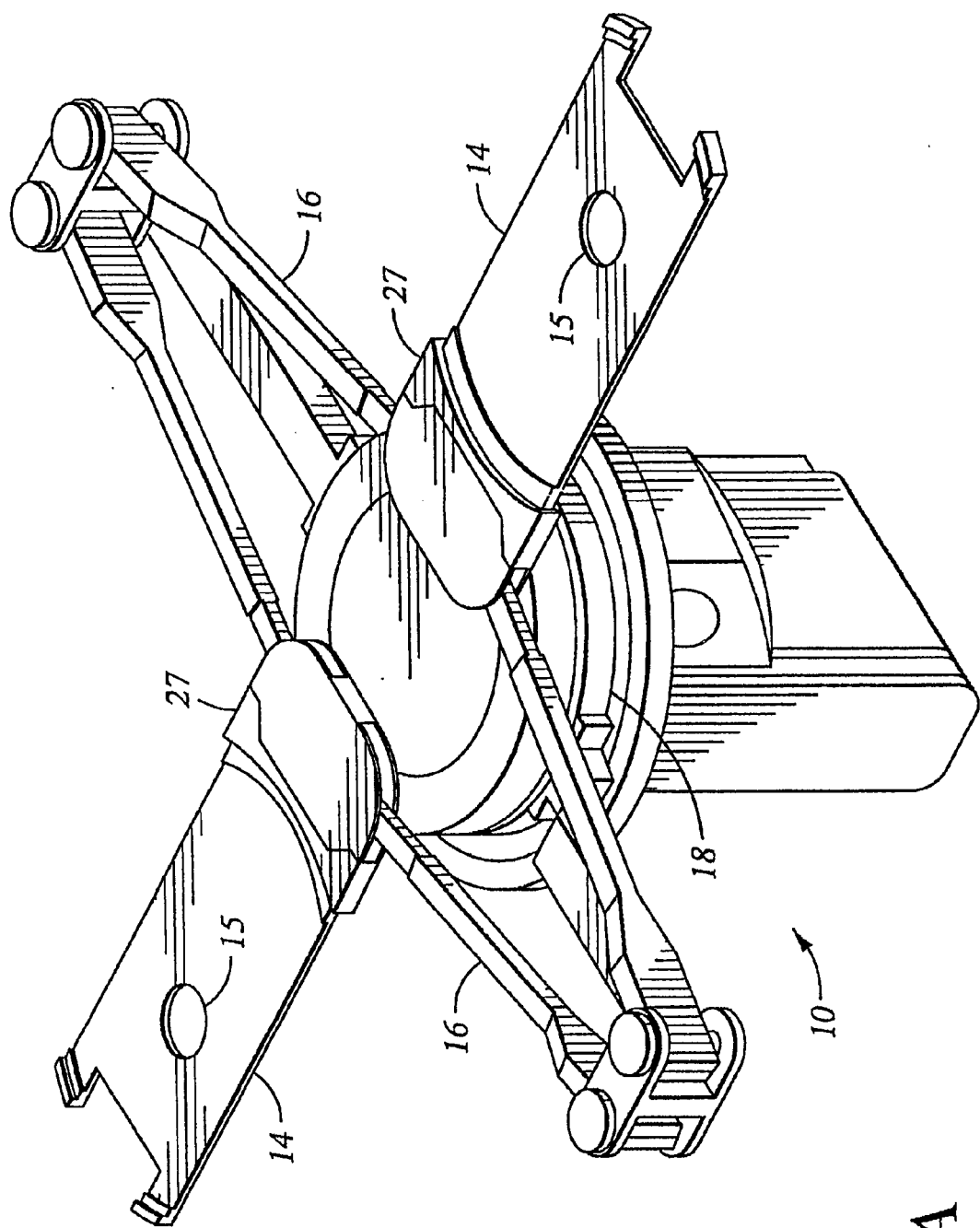
FIG. 1a is a perspective view of a wafer handler with a prior art end effector.
Figure 1B:
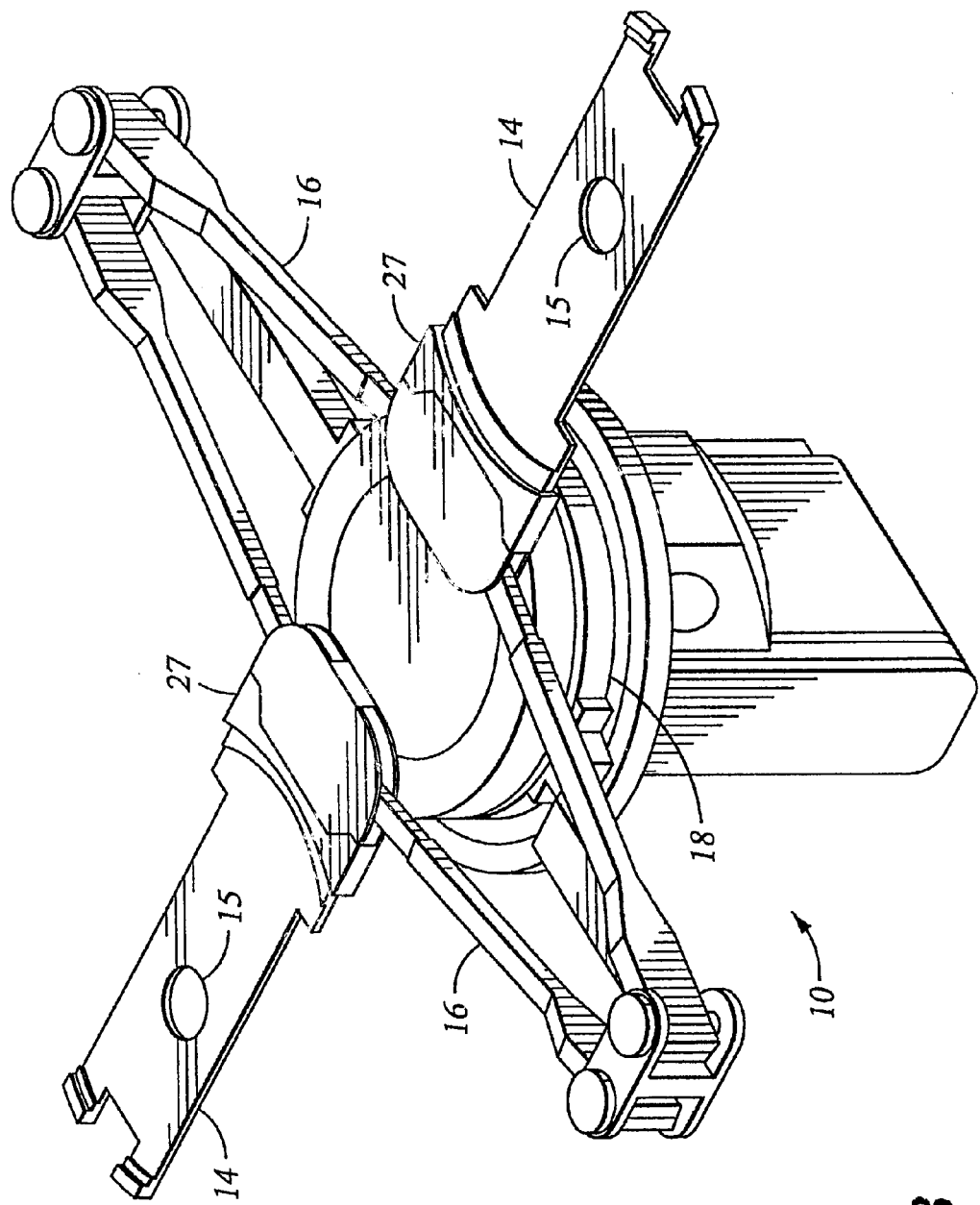
FIG. 1b is a perspective view of a wafer handler with another prior art end effector.
Figure 1C:
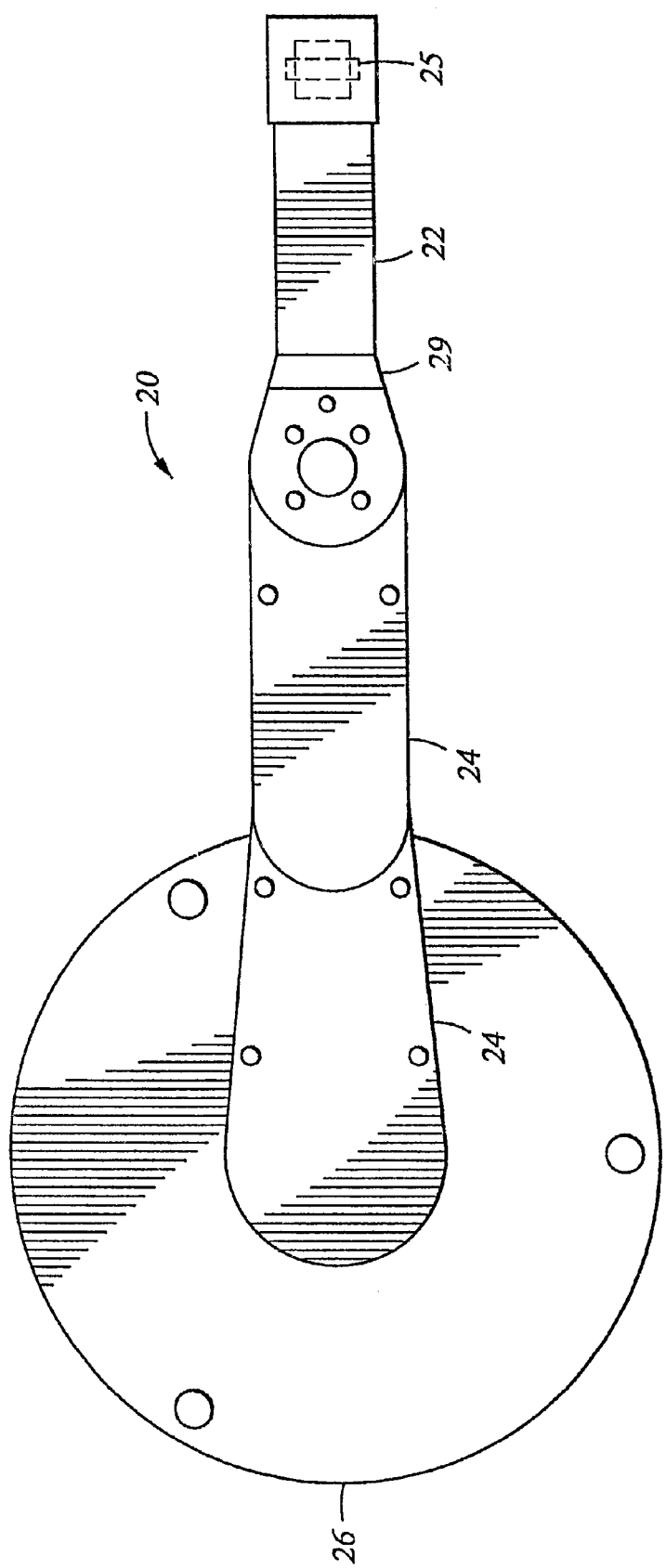
FIG. 1c is a top view of a wafer handler with still another prior art end effector.
Figure 3:
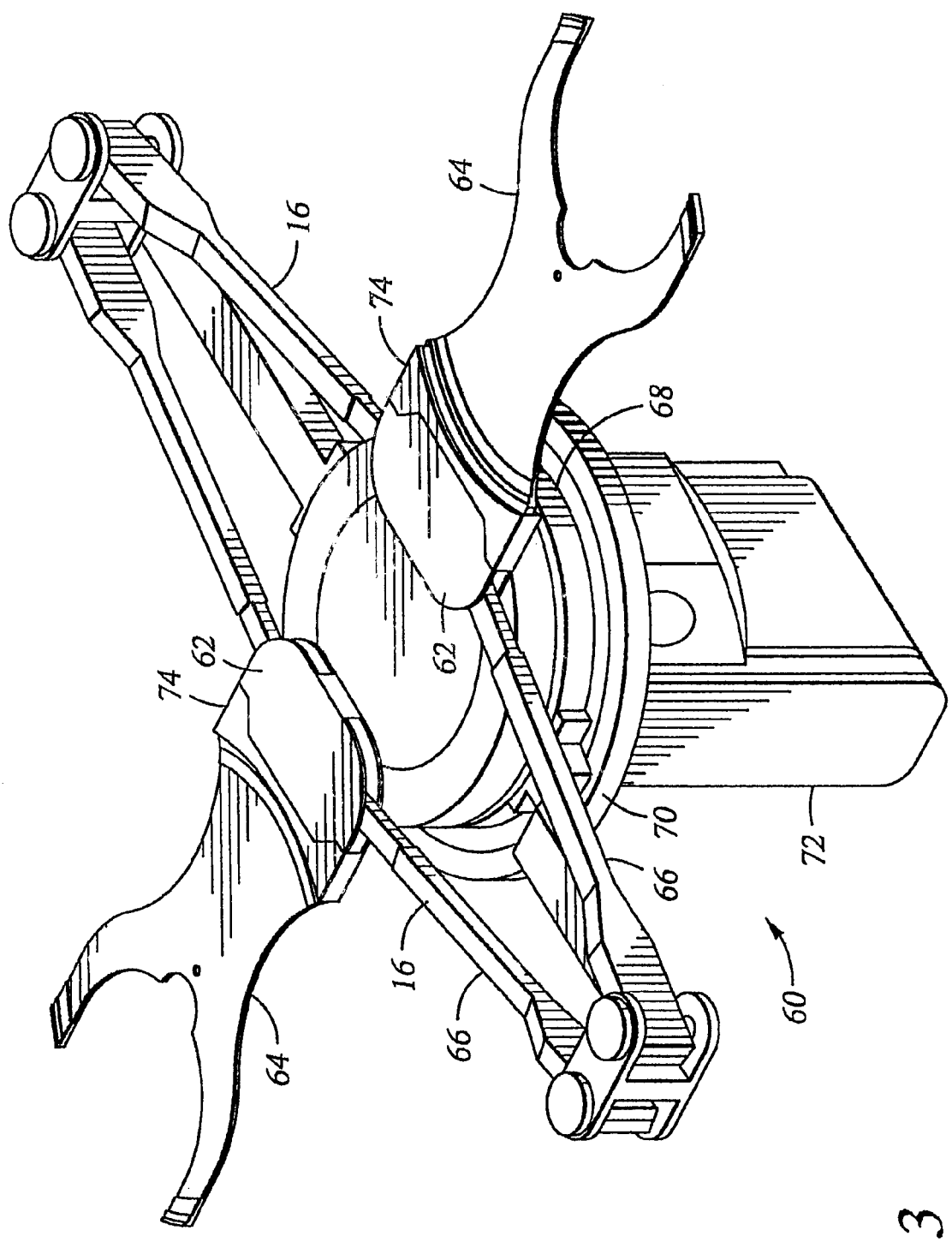
FIG. 3 is a perspective view of a wafer handler with an end effector according to the present invention.

The wafer handlers 44, 42 are depicted as single-blade robots, meaning they have attachments for only one blade, or end effector, and can support only one wafer at a time. FIG. 3 shows a dual-blade wafer handler 60, meaning that it has attachments 62 for two end effectors 64 and can support two wafers at a time. The present invention may be used with either of these types of wafer handlers and any other appropriate wafer handler, such as the type shown in FIG. 1c.

The wafer handler 60 has a mounting plate 70 for mounting to the bottom. of the interior of the chamber in which it resides. Above the mounting plate is a rotational portion 68, which rotates relative to the mounting plate 70 in order to align the end effectors 64 with a chamber opening order to insert or remove a wafer. An actuating arm assembly 66 moves the end effectors 64 inward and outward in a line radial with the pivot point of the rotational portion 68. Below the mounting plate is a motor assembly 72 for driving the movements of the wafer handler 60.

The end effectors 64 have a wrist 74 (FIGS. 3 and 4) for mounting to the attachments 62 in order to fix one end of the end effectors 64. The free end has two fingers 76, or projections, defined by the outer opposing edges 78 and the inner facing edges 80. The end effector 64 has a wafer sense cutout 82 at a standard location for permitting a sensor beam, such as an infrared beam, to detect the presence of a wafer on the end effector 64. The end effector 64 also has a wafer center-finder hole 84. An operator may open the chamber and insert a pin into this hole 84 in order to calibrate the center of the end effector 64, so that the end effector 64 will be properly aligned when lifting a wafer from a support or setting the wafer down onto a support. Thus, the wafer may also be properly aligned when the end effector 64 sets it down, so position-sensitive processes will perform correctly, and so the wafer will not be damaged. Calibration may be verified at regular intervals to ensure that the end effector 64 does not slowly drift from its proper position, or it may be done when misalignment of the end effector 64 is suspected.

Figure 4:
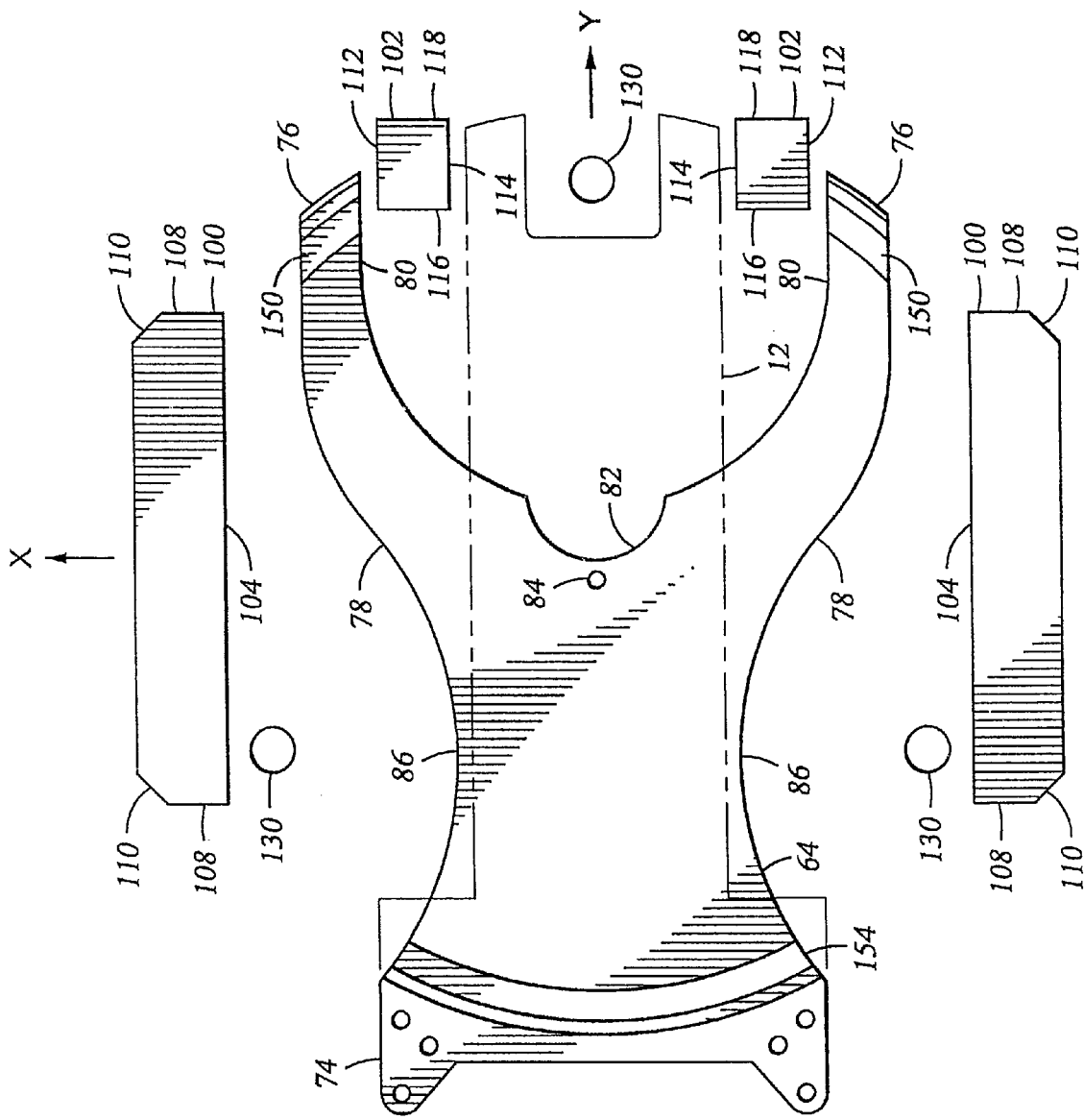
FIG. 4 is a top view of the end effector with the exclusion zones.

The outer edges 78 curve in a unique hourglass shape starting with an inward taper near the wrist 74, or fixed end, of the end effector 64. The outer edges 78 curve until they taper outwardly to form recesses 86 in the opposing outer edges 78. The outward taper of the outer edge curvature extends the end effector 64 to a width greater than the width at the fixed end and reduces to no taper at the free end of the end effector 64. The inner facing edges 80 curve together to form a recess that extends into the area for the wafer sense cutout 82. The recesses in the end effector 64 limit the mass of the end effector 64, so the end effector 64 is lightweight, without forfeiting the strength of the end effector 64 beyond the limit necessary to support a wafer thereon. The present invention is not limited to the particular shape shown in the top view of FIG. 4. Rather, other contours for the edges 78, 80, including angled edges, fall within the scope of the invention. For comparison, the prior art end effector 12 is shown in dashed lines in FIG. 4 illustrating the narrow constant width of the end effector 12, so that the fingers at its free end pass between the exclusion zones 102.

The end effector 64 is designed to support 300 mm wafers, but other end effectors incorporating the present invention may be designed to support wafer of other size, such as 100 mm, 150 mm or 200 mm. For 300 mm wafers, Semiconductor Equipment and Materials International (SEMI) created the SEMI 300 mm Wafer Carrier and Interface Standard to define. inter alia, an industry standard configuration for a wafer carrier. Generally, a wafer carrier, such as a wafer cassette, supports one or more wafers on a set of shelves. A wafer handler must be able to remove a wafer from the carrier, so the wafer handler end effector must not cross through the shelves. Therefore, standard dimensions must be defined for the shelves so that all end effectors can interface properly with all wafer carriers, regardless of the vendors. The SEMI 300 mm Wafer Carrier and Interface Standard defiles certain areas, called exclusion zones, in which water carrier shelves may be disposed and which end effectors must avoid. The exclusion zones for 300 mm wafers are shown in FIG. 4 by the areas 100, 102. The dimensions of the exclusion zones 100, 102 are defined by their relation to the center point of an exemplary wafer seated on the wafer cassette shelves. In FIG. 4 the center point of a wafer is generally the same as the center of the center finder hole 84.

The distance from the facing edges 104 of the exclusion zones 100 to the center point is about 125 mm, so the facing edges 104 are about 250 mm apart, giving about 25 mm overlap on each edge of a 300 mm wafer. The distance from the opposing edges 106 of the exclusion zones 100 to the center point is about 154 mm, so the opposing edges 106 are about 308 mm apart, giving a 4 mm clearance on either side of a 300 mm wafer. Edges 108 of each exclusion zone 100 are about 170 mm apart, and an imaginary x-axis at the midline between the edges 108 of both exclusion zones 100 aligns with the center point. Edges 110 are about 170 mm from the center point. The distance between opposing edges 112 of exclusion zones 102 is about 150 mm and an imaginary y-axis at the midline between the edges 112 aligns with the center point. Facing edges 114 are about 100 mm apart and equidistant from the y-axis. Edges 116 are about 120 mm from the x-axis, and edges 118 are about 152 mm from the x-axis.

The end effector 64 avoids the exclusion zones 100, 102 defined by the SEMI 300 mm Wafer Carrier and Interface Standard. The end effector 64 does not cross over any of the exclusion zones 100, 102 when lifting or setting down a wafer because, otherwise, the support shelves in the wafer cassette will interfere with the end effector's movement.

Since the fingers 76 at the free end of the end effector 64 must pass between edges 112 of exclusion zones 102 and edges 104 of exclusion zones 100 the facing edges 80 near the free end can be no closer than about 150 mm, and the opposing edges 78 near the free end can be no fisher apart than about 250 mm. Preferably, the inner facing edges 80 are about 160 mm apart, and the outer opposing edges 78 are about 200 mm apart, near the free end.

In addition to the 300 mm exclusion zones, the end effector 64 must be able to insert between a set of lift pins 130 commonly used to lift a wafer in various applications. A typical configuration for a set of lift pins 130 places them equidistant from the center of a wafer seated on top of them and at about 120° angles to each other so that the lift pins 130 provide a stable three-point support for the wafer. Thus, a preferred spacing for the lift pins 130 is about 120 mm from the center of a wafer to the near edge of the pins, giving a clearance of about 4 mm on either side of an end effector 64 that is 200 mm wide at its outer opposing edges 78.

Figure 6:
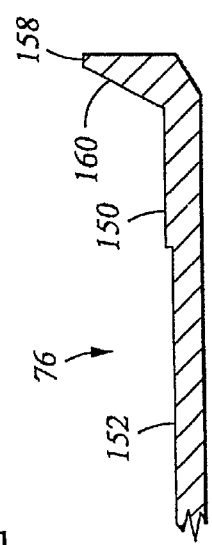
FIG. 6 is a side view of another embodiment of a finger at the free end of the end effector.
Figure 5:
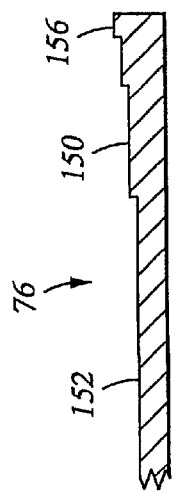
FIG. 5 is a side view of a finger at the free end of the end effector.

FIG. 5 shows a cross section of a finger 76. A shelf 150 near the free end support the wafer and provides clearance for the bottom side of a wafer above the level of the main part 152 of the end effector 64. Another shelf 154 supports the wafer near the fixed end. The finger 76 has a low-profile end shoe 156 for laterally containing the wafer. FIG. 6 shows an alternative embodiment for a finger 76. The alternative finger 76 has a similar shelf 150 for supporting the wafer above the main part 152, but the alternative finger 76 has a high-profile end shoe 158 for laterally containing the wafer. The high-profile end shoe 158 permits the angled surface 160 to provide some slight wafer realignment if the wafer is radially offset up to about 3.7 mm, but the high profile limits the clearance of the end effector 64 in narrow spaces. The low-profile end shoe 156, on the other hand, provides greater clearance in tight spaces, such as between the wafers in a wafer cassette. Thus, the end effector 64 with the low-profile end shoe 156 is typically used in the buffer chamber 36, and the end effector 64 with the high-profile end shoe 158 is typically used in the transfer chamber 32.

Figure 7:
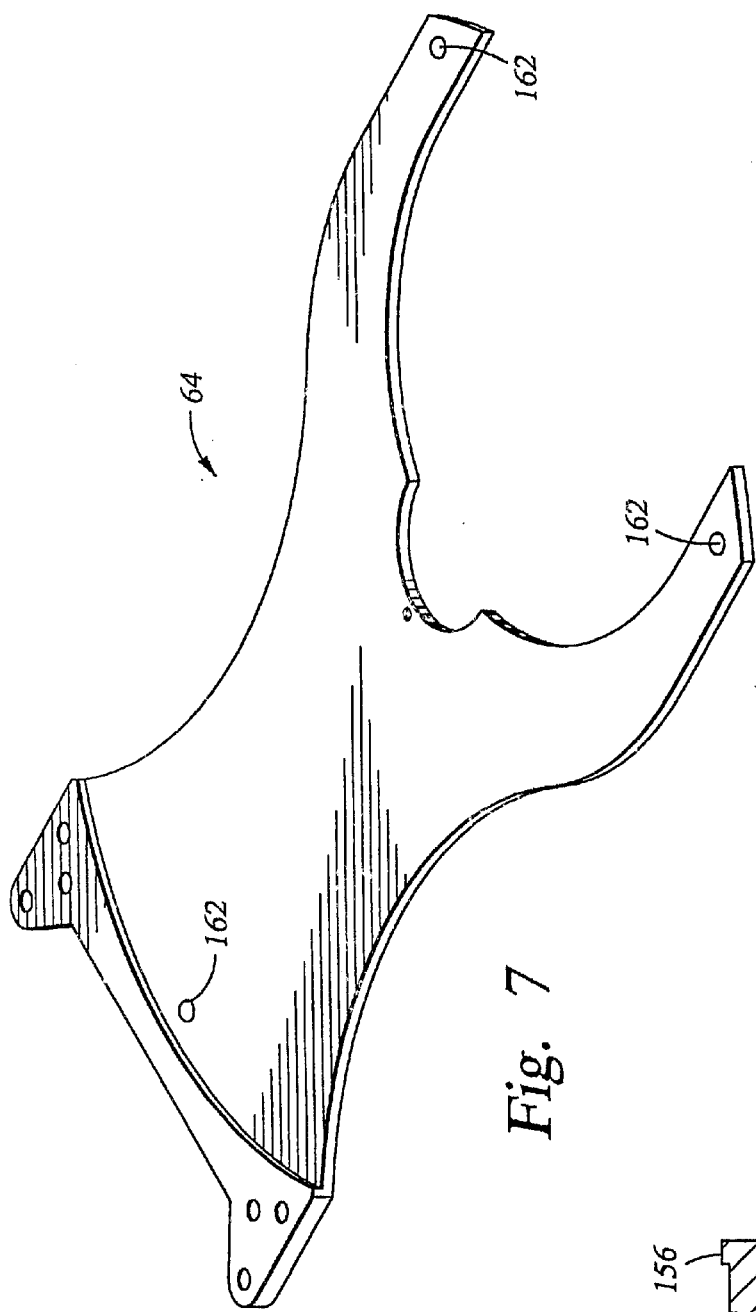
FIG. 7 is a perspective view of another embodiment of an end effector.

An alternative embodiment for an end effector 64 is shown in the perspective view of FIG. 7. This embodiment of the end effector 64 has the same general dimensions as the end effector 64 shown in FIG. 4, but has ball, bump, or supports 162 for the wafer. The ball supports 162 form a three-point wafer support configuration for minimum contact with the wafer. A three-point wafer-to-blade contact typically requires fairly evenly spaced contact points for spacing for easily adapting the end effector 64 to a three-point contact.

An advantage of the end effector 64 described herein is that it does not intrude on the SEMI specified wafer handling exclusion zones, so the end effector 64 can be used in any location in a system 30, including the transfer chamber 32, the buffer chamber 36 and the mini-environment environment 54. Another advantage is that the extra width of the free end provides a very stable support for the wafer, so the transfers may be faster, providing a higher throughput. Yet another advantage is that the extra width of the free end provides a more evenly distributed support configuration, so the wafer does not bow under its own weight and contact the middle of the end effector 64. Still another advantage of the end effector 64 is that the recesses remove unnecessary mass from the end effector 64, so the end effector 64 can be moved more easily and doesn't require a stronger, more expensive, wafer handler 60.

While the foregoing is directed to the preferred embodiment of the present invention, other and further embodiments of the invention may be devised without departing from the basic scope thereof, and the scope thereof is determined by the claims which follow.

What is claimed is:

1. A vacuum processing system, comprising:
    a first chamber;
    at least one second chamber cooperatively engaged with the first chamber;
    a wafer handler disposed within the first chamber; and
    an end effector having:
        a fixed end attached to the wafer handler and a free end;
        a first wafer support proximate to the fixed end and having opposing edges;
        two wafer end supports spaced apart and proximate to the free end, the wafer end supports having opposing edges wider than the opposing edges of the first wafer support, the first wafer support and the two wafer end supports having at least one end shoe adapted to capture the wafer laterally between the two wafer end supports and the first wafer support and each wafer end support adapted to support a bottom side of a wafer;

a wafer sense cutout;

an end recess between the two wafer end supports; and a first side recess and a second side recess disposed between at least the first wafer support and the two wafer end supports on opposing sides of the end effector.

2. The vacuum processing system of claim 1, wherein the two wafer end supports have facing edges spaced at least about 150 mm to about 160 mm.

3. The vacuum processing system of claim 1, wherein the opposing edges of the two wafer end supports are spaced at most about 200 mm to about 250 mm.

4. The vacuum processing system of claim 1, wherein the end effector is capable of inserting the wafer into or removing the wafer from a wafer cassette having two inner exclusion areas and two outer exclusion areas for a 300 mm diameter wafer and the two wafer end supports are spaced closer together than the two outer exclusion areas and further apart than the two inner exclusion areas.

5. The vacuum processing system of claim 1, wherein the opposing sides taper inwardly between at least the first wafer support and the two wafer end supports from the first width, curve to an outward taper, and taper outwardly to the second width.

6. The vacuum processing system of claim 1, wherein the end recess extends into the wafer sense cutout from the free end.

7. A wafer handler, comprising:

a motion arm; and an end effector having:

a fixed end attached to the motion arm;

a first wafer support proximate to the fixed end and having opposing edges;

a free end;

two wafer end supports spaced apart and proximate to the free end, the wafer end supports having opposing edges wider than the opposing edges of the first wafer support, the first wafer support and the two wafer end supports having at least one end shoe adapted to capture the wafer laterally between the two wafer end supports and the first wafer support and each wafer end support adapted to support a bottom side of a wafer, wherein opposing sides of the end effector taper inwardly between at least the first wafer support and the two wafer end supports from a first width, curve to an outward taper, and taper outwardly to a second width; and an end recess between the two wafer end supports.

8. The wafer handler of claim 7, wherein the two wafer end supports have facing edges spaced at least about 150 mm to about 160 mm.

9. The wafer handler of claim 7, wherein the opposing edges of the two wafer end supports are spaced at most about 200 mm to about 250 mm.

10. The wafer handler of claim 7, wherein the end effector is capable of inserting the wafer into or removing the wafer from a wafer cassette having two inner exclusion areas and two outer exclusion areas for a 300 mm diameter wafer and the two wafer end supports are spaced closer together than the two outer exclusion areas and further apart than the two inner exclusion areas.

11. The end effector of claim 7, wherein the first wafer support and the two wafer end supports form a three-point support.

12. The end effector of claim 7, further comprising a wafer sense cutout, wherein the end recess extends into the wafer sense cutout.

13. An end effector for use with a wafer handler in a chamber and for supporting a wafer being transferred through the chamber, the end effector comprising:

a fixed end attachable to the wafer handler;

a first wafer support proximate to the fixed end and having opposing edges;

a free end;

two wafer end supports spaced apart and proximate to the free end, the wafer end supports having opposing edges wider than the opposing edges of the first wafer support, the first wafer support and the two wafer end supports having at least one end shoe adapted to capture the wafer laterally between the two wafer end supports and the first wafer support and each wafer end support adapted to support a bottom side of a wafer, wherein opposing sides of the end effector taper inwardly between at least the first wafer support and the two wafer end supports from a first width, curve to an outward taper, and taper outwardly to a second width.

14. The end effector of claim 13, wherein the two wafer end supports have facing edges spaced at least about 150 mm to about 160 mm.

15. The end effector of claim 13, wherein the opposing edges of the two wafer end supports are spaced at most about 200 mm to about 250 mm.

16. The end effector of claim 13, wherein the first wafer support and the two wafer end supports form a three-point support.

* * * * *

UNITED STATES PATENT AND TRADEMARK OFFICE
CERTIFICATE OF CORRECTION

PATENT NO.    : 6,409,453 B1
DATED         : June 25, 2002
INVENTOR(S)   : Jeff Brodine et al.

It is certified that error appears in the above-identified patent and that said Letters Patent is hereby corrected as shown below:

Column 2,
Line 4, please change "level of tie" to -- level of the --.
Line 13, please delete the hyphen between "the-load".
Line 24, please change "the wafer handler" to -- The wafer handler --.

Column 3,
Line 67, please delete "environment,".

Column 4,
Line 17, please add after "that", -- are at most about 200 mm to about 250 mm apart. The wide spacing of the fingers provides a --.
Line 21, please change "arid" to -- and --.
Line 62, please add after "processing", -- system 30 of the present invention. This system 30 is of the type that is typically used for --.

Column 5,
Line 40, add after "may be", -- separate pre-clean chambers. --.
Line 41, please change "transition" to -- transitions --.
Line 48, please change "One load" to -- The load --.
Line 56, please change "minienvironment" to -- mini-environment --.

Column 6,
Line 19, please change "opening order" to -- opening in order --.

Column 7,
Line 1, please change "wafer of other size," to -- wafers of other sizes, --
Line 5, please change "define.inter" to -- define, inter --.
Line 51, please change "fisher" to -- further --.
Line 67, please change "support" to -- supports --

UNITED STATES PATENT AND TRADEMARK OFFICE
CERTIFICATE OF CORRECTION

PATENT NO. : 6,409,453 B1
DATED : June 25, 2002
INVENTOR(S) : Jeff Brodine et al.

It is certified that error appears in the above-identified patent and that said Letters Patent is hereby corrected as shown below:

<u>Column 8,</u>
Line 26, please change "for" to -- for stable support. The wide spacing of the balls 162 near the free end provides the fairly even --.
Line 33, please delete "environment".

Signed and Sealed this

Seventh Day of January, 2003

JAMES E. ROGAN
*Director of the United States Patent and Trademark Office*